United States Patent [19]

White

[11] Patent Number: 4,539,536
[45] Date of Patent: Sep. 3, 1985

[54] PARAMETER-SETTING APPROACH TO OBTAIN HIGH PERFORMANCE CTD TRANSVERSAL FILTERS FROM DEVICES WITH SIGNIFICANT CTI AND FPN

[75] Inventor: Stanley A. White, Santa Ana, Calif.

[73] Assignee: Rockwell International Corporation, El Segundo, Calif.

[21] Appl. No.: 441,195

[22] Filed: Nov. 12, 1982

[51] Int. Cl.³ .................... H03H 15/02; H03H 17/02
[52] U.S. Cl. .................................. 333/165; 333/166; 333/174; 364/724; 377/58
[58] Field of Search ......... 333/17 R, 18, 28, 165–166, 333/174; 328/167; 377/58–59, 68; 364/724, 725, 825, 826, 827

[56] References Cited

U.S. PATENT DOCUMENTS

| | | | |
|---|---|---|---|
| 3,868,516 | 2/1975 | Buss | 333/18 X |
| 3,946,248 | 3/1976 | Buss | 377/58 |
| 4,052,559 | 10/1977 | Paul et al. | |
| 4,143,285 | 3/1979 | White | |

OTHER PUBLICATIONS

"An Adaptive Recursive Digital Filter" by S. A. White, Proceedings of Asilomar Conference on Circuits, Systems and Computers, Pacific Grove, CA, Nov. 1975, pp. 21–25.
"An Input-Weighted CCD Transversal Filter", T. Sakave, et al., Japanese Journal of Applied Physics, vol. 16, (1977), Supp. 16-1, pp. 391–396.
"An Electronically Programmable Transversal Input Filter", R. A. Haken, IEEE Journal of Solid-State Circuits, vol. SC-17, No. 1, Feb. 1982, pp. 34–39.
"Charge-Coupled Devices", D. F. Barbe, ed., Section 5.21, Springer-Verlag, Pub. 1980, pp. 100–106.

*Primary Examiner*—Marvin L. Nussbaum
*Attorney, Agent, or Firm*—H. Fredrick Hamann; Randall G. Wick

[57] ABSTRACT

A charge-transfer-device (CTD) transversal filter which makes use of tap-weight-adjustment circuitry for removing effects of charge-transfer inefficiency (CTI) and fixed-pattern noise (FPN). The tap weights are adjusted by measuring the response of the CTD-transversal filter to an isolated pulse input and to a zero-frequency input. The results of the measurements and reference-filter coefficients are used by the tap-weight-adjustment circuitry in order to set tap weights for the CTD-transversal filter. The tap-weight-adjustment circuitry allows the frequency response of the CTD transversal filter to be accurately tailored even though the CTD filter suffers imperfections due to CTI and FPN.

11 Claims, 2 Drawing Figures

PARAMETER-SETTING APPROACH TO OBTAIN HIGH PERFORMANCE CTD TRANSVERSAL FILTERS FROM DEVICES WITH SIGNIFICANT CTI AND FPN

The Invention herein described was made in the course of or under a contract or subcontract thereunder, with the Department of the Air Force.

FIELD OF THE INVENTION

The invention relates generally to the field of electronic signal filters and pertains more particularly to circuitry for adjusting the tap weights in charge-transfer-device transversal filters.

BACKGROUND OF THE INVENTION

Charge-transfer-devices have been used in the construction of transversal filters. A charge-transfer-device (CTD) transversal filter includes individual charge-storage cells each connected to separate taps and connected together in series to form a tapped delay line wherein the outputs from each tap are weighted and summed together to produce a filter output. Rather than acting as ideal delay line elements, the individual CTD cells each act as a low-pass filter. That is, the CTD cells are connected together as a delay line in which packets of charge are passed from cell to cell. Each CTD cell has charge transfer inefficiency which expresses the ratio between the amount of charge trapped within the cell, to the amount of charge which was first transferred into the cell. For a completely efficient CTD cell, the amount of charge transferred out would equal the amount of charge transferred in. In practice, CTD cells are less than completely efficient and the charge-transfer inefficiency varies from cell to cell. As a consequence of the way in which the amount of charge in each CTD cell is detected, the sensing of charge levels is different from cell to cell, thus producing what is known as fixed-pattern noise. In the absence of fixed-pattern noise, the sensing of charge would be uniform from cell to cell. The presence of charge-transfer inefficiency (CTI) and fixed-pattern noise (FPN) causes the performance of CTD, transversal filters to differ from the performance which is expected of and computed for, idealized transversal filters.

CTD transversal filters may be used in commercial television sets for ghost cancellation, in aeronautical electronics for multiband-radio communications, and in telephone systems for equalization. CTD filters have particular advantages in allowing the processing of high-frequency signals and allow the production of filters on integrated-circuit micro chips. A typical method for setting the tap weights of a transversal filter is to compute the required tap-weighting coefficients for an idealized transversal filter, given the desired frequency response of the filter, and using standardized computational methods for determining the coefficients. The tap weights used in a transversal filter may be fixed at the time of manufacture of the filter or at some subsequent time by manual adjustment. Also, the tap weights of a transversal filter may be dynamically adjusted through a process of adaptation during the operation of the filter.

SUMMARY OF THE INVENTION

It is an object of the invention to provide a CTD transversal filter having a desired frequency response which is substantially unaffected by the charge-transfer inefficiency or fixed-pattern noise of the CTD transversal filter.

It is another object of the invention to provide circuitry for adjusting the tap weights in a CTD transversal filter in order to achieve the desired frequency response for the CTD transversal filter and to remove the effects of charge-transfer inefficiency and fixed-pattern noise.

Another object of the invention is to provide a method for adjusting the tap-weight coefficients in a CTD transversal filter by applying a sequence of testing signals at the input to the transversal filter and measuring the responses produced by the test signals in order to achieve a desired frequency response for the transversal filter by removing the effects of charge-transfer inefficiency and fixed-pattern noise in the CTD transversal filter.

The invention provides tap-weight coefficient-adjustment circuitry for connection to a charge-transfer-device (CTD) transversal filter so that the tap-weight coefficients of the CTD transversal filter may be adjusted. The tap-weight-adjustment circuitry includes a reference transversal filter which is provided with idealized-response tap-weight coefficients so that the difference between the response of the CTD transversal filter and the response of the reference transversal filter to a signal which has been generated by the actual CTD-delay-line output signal may be determined. Measurements of the charge-transfer inefficiency and fixed-pattern noise are made by zero frequency and pulse test signals applied to the CTD transversal filter. The measurements of CTI and FPN are used in the tap-weight-adjustment circuitry, together with the comparison between the CTD and reference transversal filters, to affect changes in the tap weights of the CTD transversal filter.

The CTD transversal filter, which is adjusted in accordance with the invention, provides substantial advantages in achieving a desired frequency response having the effects of charge-transfer inefficiency and fixed-pattern noise compensated. The tap-weight coefficient-adjustment circuitry may be used as a part of a manufacturing fixture so that the tap weights for the CTD transversal filter may be fixed during the manufacturing process. For example, the tap-weight coefficients may be adjusted using standard, commercially available laser scribers for adjusting the values of resistance elements used for setting tap-weight coefficients in a CTD transversal filter. In such an application, the tap-weight-adjustment circuitry would be used to control the operation of the laser scribers. Also, the tap-weight adjustment circuitry may be incorporated as a portion of the circuitry on an integrated circuit micro chip so that both the CTD transversal filter and the tap-weight coefficient-adjustment circuitry may be contained together on the same micro chip. For example, such an implementation would allow the frequency response of the CTD transversal filter to be readjusted from time to time.

DESCRIPTION OF THE PREFERRED EMBODIMENT

Figure 1:
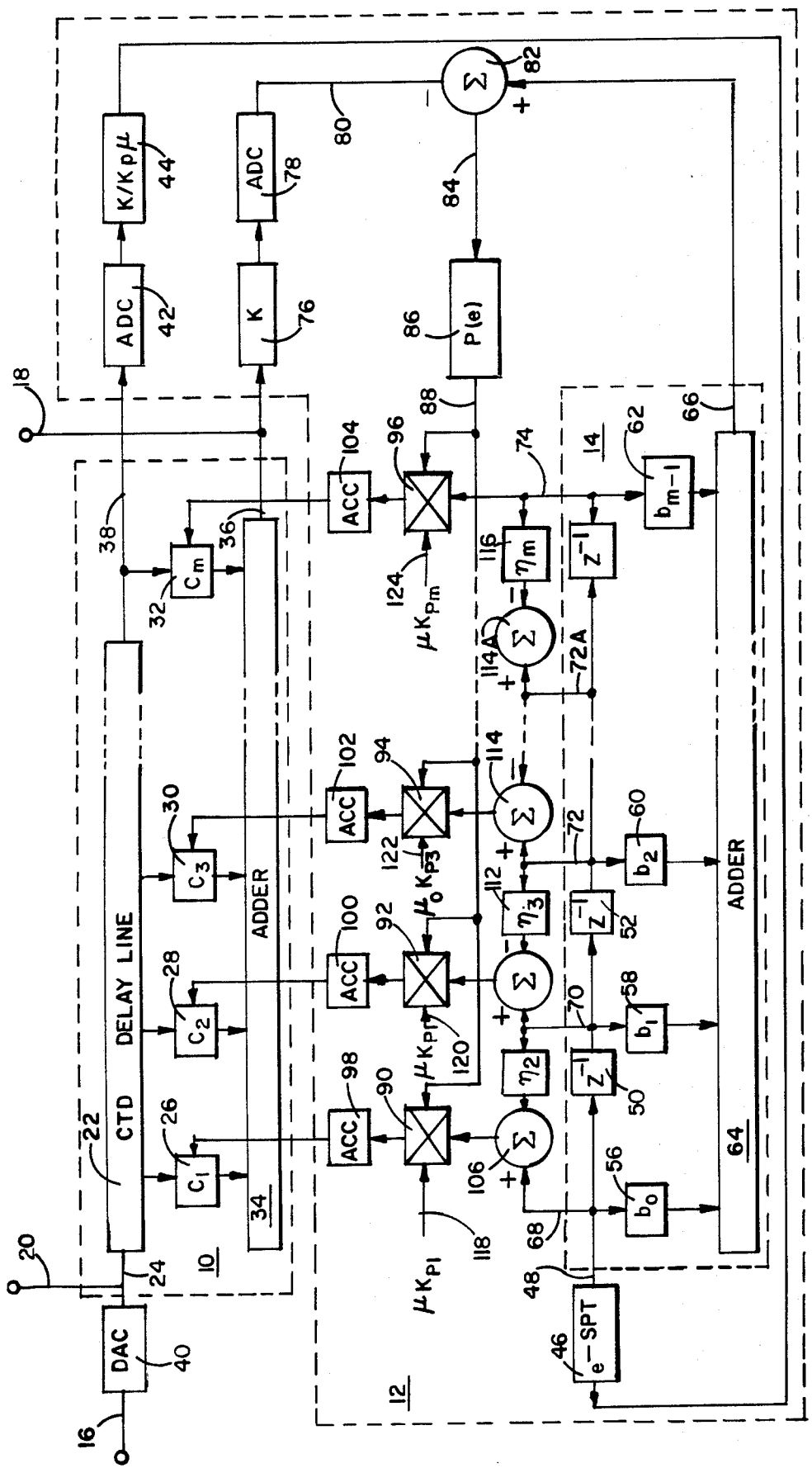
FIG. 1 is a block diagram of a CTD transversal filter and showing the tap-weight coefficient-adjustment circuitry of this invention connected thereto.

Referring first to FIG. 1, a charge-transfer-device (CTD) transversal filter 10 is shown connected to tap weight adjustment circuitry 12 which includes a reference transversal filter 14. The function of the CTD transversal filter 10 is to process analog input signals received on the line 24 in order to produce a filtered output signal on the line 18. Digital input test signals appear on line 16 and are converted to analog signals for processing by the digital-to-analog converter 40 which is a part of the test assembly. The function of the adjustment circuitry 12 is to adjust the signal-processing performance of the CTD transversal filter 10.

The CTD transversal filter 10 includes a charge-transfer-device (CTD) delay line 22 which consists of a plurality of charge-storage cells which are connected in series so that a signal placed on the input line 24 to the delay line 22 will propagate down the delay line 22 at a rate determined by an external clock (not shown). The delay line 22 consists of charge-storage cells which are of a standard construction and which exhibit charge-transfer inefficiency (CTI) and fixed-pattern noise (FPN). The number of charge-storage cells in the delay line 22 is equal to the number M. Each of the charge-storage cells of the delay line 22 is tapped and connected to a weighting-coefficient-gain stage, of which the stages 26, 28, 30 and 32 are typical.

The number of tap-weighting stages is equal to the number of charge-storage cells in the delay line 22. The number M is chosen to provide enough stages to accomplish the type of filtering required from the transversal filter 10 in accordance with well-known transversal-filter design techniques. Although four stages (26, 28, 30 and 32) are shown in the drawing, more or fewer stages may be provided depending on the filtering task to be accomplished by the filter 10. Each of the tap-weighting stages 26, 28, 30 and 32 may consist of a simple amplifier, wherein the gain of each amplifier may be individually varied in order to provide selected weighting for each of the taps on the delay line 22.

The output of each of the tap-weighting stages 26, 28, 30 and 32 is added together or summed in the adder 34 in order to produce the output signal 36 for the transversal filter 10. The output signal on the line 36 is brought out to the terminal 18 which presents the signal which is denoted as the filtered output of the transversal filter 10. A signal is also provided on the line 38 which is connected to the output of the last charge-storage element on the delay line 22. The signal on the line 38 is not a filtered-signal output but instead is a signal which may be used by the tap-coefficient-adjustment circuitry 12 for setting the coefficients or gains used by the stages 26, 28, 30 and 32.

The coefficient tap-weight-adjustment circuitry 12, illustrated in FIG. 1, is shown in block-diagram form and may be constructed using conventional electronic-circuit-design techniques or may be constructed using analogous programmed-computer techniques in which the operations symbolized by the blocks in the diagram are performed by computer software operations analogous to the block functions.

The circuitry 12 includes an analog-to-digital converter 42 which is connected through gain and delay stages 44 and 46 to the input 48 of the reference transversal filter 14. The function of the converter 42 is to change the analog signals on the line 38 into digital signals which may be used by the adjustment circuitry 12. The gain stage 44 and delay stage 46 perform operations on the digital signal produced by the converter 42 in accordance with the mathematical techniques described in further detail below.

The function of the stage 46 is to delay the signal passing from the line 38 to the line 48 so that the filters 14 and 10 operate in synchronism. The stage 46 is set so that $D = P + M$, wherein P is the period of the pseudo-random-noise-sequence test signal provided to the input 16 in order to allow adjustment of the tap coefficients in the CTD filter 10. M is the number of tap coefficients in the filter 10, and T is the period of the clocking signal used in the filter 10.

The reference transversal filter 14 includes a plurality of delay elements 50, 52 and 54 which are one less in number than the number M. Tap coefficient stages 56, 58, 60 and 62 have inputs connected to taps of the transversal filter 14. The number of stages (such as 56, 58, 60 and 62) is equal to the number M. The outputs of the stages 56, 58, 60 and 62 are added together or summed in the adder 64 which produces the reference-transversal-filter 14 output on the line 66. The transversal filter 14 also provides unweighted tap outputs on the line 68, 70, 72, 72A and 74.

A gain stage 76 is connected to the transversal filter 10 output line 36 and provides an input signal to the analog-to-digital converter 78 which provides a digital output signal on the line 80. A summation stage 82 has a non-inverting input connected to the line 66 and an inverting input connected to the line 80 in order to produce an error-function-output signal on the line 84. The function of the summation stage 82 is to compare the output (on line 66) of the transversal filter 14 with the output (as conditioned on line 80) of the CTD transversal filter 10.

A performance criterion stage 86 receives the error function signal input on line 84 and produces an output signal on the line 88. The operation of the performance-criterion stage 86 may provide for minimization of the mean-square error or minimization of the mean-average error in the signal presented on the line 84. The function of the performance-criterion stage 86 is to evaluate how closely the output provided from the CTD-transversal filter 10 compares with the output provided from the reference transversal filter 14. The signal on the line 88 is provided as an input to the multiplier stages 90, 92, 94 and 96. The multiplier stages 90, 92, 94 and 96 are representative of the plurality of multipliers (M in number) which are provided in the coefficient-adjustment circuitry 12. Accumulator stages 98, 100, 102 and 104 have inputs connected to the outputs of the multiplier stages 90, 92, 94 and 96, respectively. The accumulators 98, 100, 102 and 104 have their outputs connected to the tap weighting stages 26, 28, 30 and 32, respectively of the CTD-transversal filter 10. The function of the accumulator stages 98, 100, 102 and 104 is to generate the proper weighting which is to be provided by the stages 26, 28, 30 and 32, respectively. The accumulator stages (98, 100, 102 and 104) also serve as integrators in responding to the inputs from the multiplier stages 90, 92, 94 and 96.

Summation stages 106, 110 and 114 provide outputs which are connected to inputs of the multiplier stages 90, 92, and 94. The line 74 from the transversal filter 14 is connected to an input of the multiplier stage 96. Gain stages 108, 112 and 116 have outputs connected to the inverting inputs of summation stages 106, 110 and 114A, respectively, and correspond to the charge-transfer inefficiencies of individual charge-storage cells of the delay line 22. The inputs of gain stages 108, 112 and 116 are connected to the lines 70, 72 and 74, respectively. The non-inverting inputs of summation stages 106, 110 and 114 are connected to the lines 68, 70 and 72A. The multiplier stages 90, 92, 94 and 96 have inputs connected to the lines 118, 120, 122 and 124, each of which is provided with inputs corresponding to numbers representing the values $u_O K_{p,1}$, $u_O K_{p2}$, $u_O K_{p,2}$, $u_O K_{p,3}$ and $u_O K_{p,M}$, as shown.

Although the CTD-transversal filter 10 shown in FIG. 1 is shown as having four taps, additional taps and coefficient-weighting stages may be added. Such additional stages are omitted in the drawing and replaced by horizontal dashed lines for clarity. Similarly, additional circuit elements similar to those shown may be added to the tap-weight coefficient-adjustment circuitry 12 in the region denoted with dashed horizontal lines.

Figure 2:
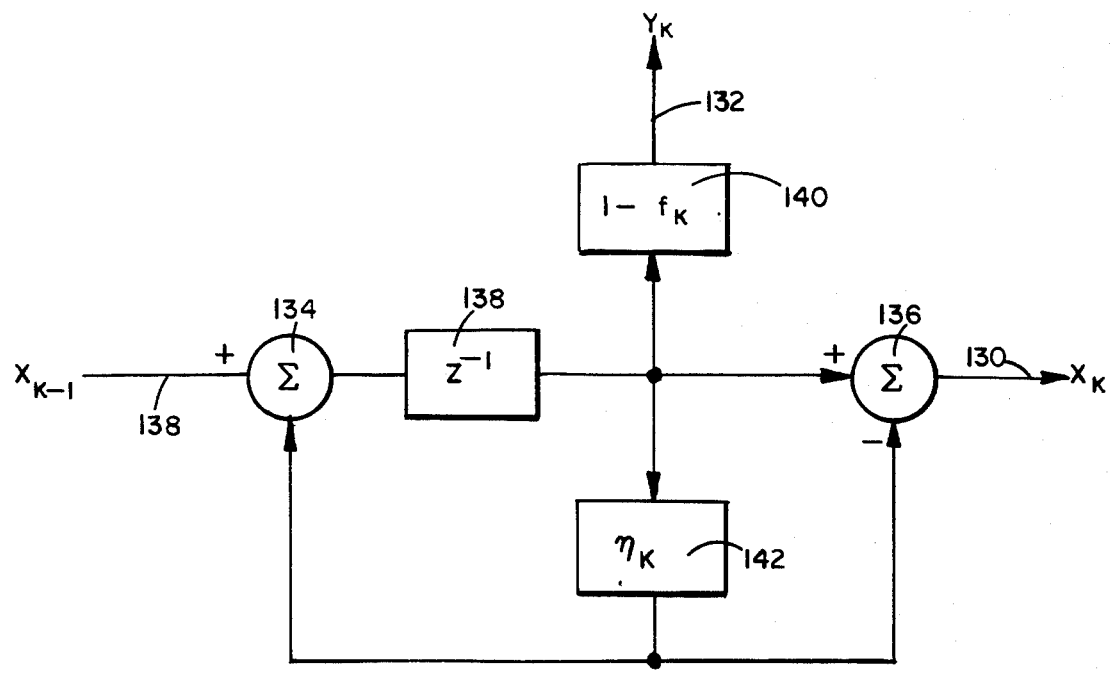
FIG. 2 is a block diagram of a CTD charge storage element which represents an element used in the CTD transversal filter of FIG. 1.

Referring next to FIG. 2, the charge storage cell 126 is a block-diagram model describing the operation and performance of a charge-storage cell in the delay line 22 of FIG. 1. This charge-transfer-device cell model is the same as that shown in a published technical paper: Buss, D. D., and Bailey, W. H., "Applications of Charge-Coupled Devices to Communications", *Technical Paper Digest, CCD Applications Conference,* San Diego, Calif., September 1973, page 83. The model includes an input line 128 (labeled $X_{K-1}$), an output line 130 (labeled $X_K$) and a tap line 132 (labeled $Y_K$). The model also includes summation stages 134 and 136, a delay stage 138, and gain stages 140 and 142. The summation stage 134 has non-inverting inputs connected to the input line 128 and the output of the stage 142. The delay stage 138 has its input connected to the output of the stage 134, and has its output connected to the input of summation stage 136. The stage 142 corresponds to the charge-transfer inefficiency of the charge-storage element 126 and has its input connected to the output of the delay stage 138. The stage 140 corresponds to the fixed-pattern noise (actually one minus the fixed-pattern-noise parameter $f_K$) and has its input connected to the output of the delay stage 138. The output of the stage 140 is connected to the line 132. The summation stage 136 has a non-inverting input connected to the output of the delay stage 138, and an inverting input connected to the output of the stage 142 in order to produce an output on the line 130.

The model shown in FIG. 2 is presented as a block diagram for simulation of the performance of an actual charge-storage cell in the delay line 22.

The following explanation of equations is presented in order to better explain the theory of operation of the invention. The explanation refers to the numbered equations which follow and which are further explained by the list of definitions which follow.

Equation (1) expresses the transfer function for the model of FIG. 2 showing the relationship between the output produced on line 130 and the input on line 128.

Equation (2) expresses the relationship for the model of FIG. 2 between the output-tap signal produced on the line 132 and the output signal produced on the line 130.

Equation (3) expresses the transfer function from the CTD input (line 24 of FIG. 1) to the nth tap output of the delay line 22 in which $X_0$ indicates the input on line 24 and $Y_n$ indicates the tap output signal (corresponding to the signal on the line 132 in FIG. 2). As with all of the equations in this description, one sample time of delay is indicated by the $z^{-1}$ transform operator.

Equation (4) expresses the overall transfer function $G(z)$ for the CTD-transversal filter 10 of FIG. 1 in which $G(z)$ expresses the ratio between the output signal on the line 36 and the input signal on the line 24. The transfer function $G(z)$ may be expressed as the ratio of two polynomials in the operator $z^{-1}$, a numerator polynomial $N(z)$, and a denominator polynomial $D(z)$.

The equation (5) represents the numerator characteristics of the transfer function $G(z)$ in which the polynomial coefficients are expressed as $\alpha_n$.

Equation (6) expresses the denominator characteristics of the transfer function $G(z)$. If the transversal filter 10 were ideal, the denominator polynomial, $D(z)$, would be identically equal to unity.

Equation (6.5) is an expression for the value of each coefficient of the numerator polynomial $N(z)$ defined in equation (5) and shows the relationship which may be determined by connecting a plurality of charge-storage elements in series, each of which has a construction like the cell 126 shown in FIG. 2.

Equation (7) illustrates the important fact that the effective tap weights (see equation (6.5)), are each composed of a weighted sum of the actual tap weight, $c_n$, and the preceding actual tap weight, $c_{m-1} c_{n-1}$. The relationship expressed in equation (7) is very important to the invention and expresses the important relationship between the polynomial coefficients for the numerator function expressed in equation (5) and the physical tap weights, $c_n$, of the CTD-transversal filter 10.

Equation (8) expresses the relationship which is observed to the construction of the CTD transversal filter 10, i.e., there is no input top weight.

Equation (9) is an expression for the pulse gain from the CTD-transversal filter input 24 to the output line for the nth tap output. Note that the actual value for the gain expressed in the equation (9) is measured by propagating an isolated pulse down the delay line 22 and measuring the ratio between the pulse maximum applied to the input line 24 and the pulse maximum measured at each of the taps on the line 22 (the inputs to the weighting stages 26, 28, 30 and 32).

The equation (10) expresses the zero frequency gain from the transversal filter input 24 to the nth tap output. The zero frequency gain is measured by transmitting a test dc signal on the line 24 and measuring the dc signal level at each of the taps along the delay line 22.

Equation (11) combines equations (9) and (10) in order to express the pulse gain in terms of the zero-frequency gain for each charge transfer cell 126 of the delay line 22.

Equation (12) is an expression for the charge-transfer inefficiency (CTI) of the $n^{th}$ cell.

Equation (13) expresses the fact that the zero-frequency gain and pulse gain for the delay line 22 cell zero is equal to one (cell zero is defined as equal to the same signal as the line 24 before any delay.

Equation (14) defines the magnitude of a modified frequency-response reference in terms of the product between the magnitude of the desired frequency response for the transversal filter 10 and the magnitude of the denominator function $D(z)$ as defined in equation (6).

Equation (15) substitutes the expression of equation (6) into equation (14).

Equation (16) places the expression of equation (14) in the frequency domain.

Equation (17) expresses the magnitude of the modified frequency-response reference in terms of a modified reference transversal filter having tap coefficients $b_n$. The magnitude response of the reference transversal filter defined by equation (17) is to closely match the magnitude response of equation (16). The reference transversal filter defined in equation (17) is produced in the circuit of FIG. 1 by the reference transversal filter 14.

Equation (18) defines an auxiliary variable u in terms of its z transform U(z).

Equation (19) is an expression for the output of the transversal filter 10, Y(z), in terms of the auxiliary variable, u.

Equation (20) defines a reference signal R(z) corresponding to the output of the reference transversal filter 14 on the line 66.

Equation (21) defines an error signal corresponding to the error signal present on the line 84. The error signal is defined in terms of the difference between the inverse transforms of R(z) and Y(z) as defined in equations (19) and (20).

A convergence-controlling parameter is used in equation (22) to control the rate of convergence of the individual tap-weight coefficient $c_k$. Equation (22) is an adjustment equation for the tap-weight coefficients in the CTD transversal filter 10. The equation (22) calls for adjustment of the tap-weight coefficients, the $c_k$, through the use of the method of steepest decent by taking the gradient of a performance criterion, $J(e_n)$, wherein the performance criterion is a single valued, unimodal function of the error signal defined in equation (21). The performance criterion $p_n$ is equal to the derivative of the performance criterion J with respect to the error signal $e_n$.

Equation (23) is a definition for the performance criterion $p_n$ such that the adjustment circuitry 12 will operate to minimize the mean-squared error of the error signal $e_n$ as presented on the line 84.

Equation (24) is an alternative definition for the performance criterion $p_n$ (alternative to the definition of the equation (23)). The equation (24) is a definition for the performance criterion that will result in a minimization of the mean absolute, or magnitude of error in the error signal presented on the line 84.

Equation (25) is an expression for the inverse transformation of equation (19) above.

Equation (26) is an expression for the partial derivative of $y_n$, as expressed in equation (25), with respect to the tap weight coefficient, $c_k$.

Equation (27) expresses the relationship between the effective tap weight and the actual tap weight for the CTD transversal filter 10, as defined in equation (7).

Equation (28) expresses the amount by which the CTD filter 10 tap-weight coefficients are to be adjusted, based on the equations (22) and (26). The tap-weight-coefficient adjustment circuitry 12 of FIG. 1 implements the adjustments defined by equation (28). That is, for example, multiplier 90 in FIG. 1 performs the operation suggested by equation (28) by multiplying together the signals obtained on lines 118, 88 and the output line of summation block 106. The summation stage 106 performs the differencing operation defined between the brackets on the right hand side of equation (28). The performance criterion, $p_n$ is provided to the multiplication stage 90 on the signal line 88. The convergence-controlling parameter and pulse-gain figure are provided as inputs on the line 118 to the multiplication stage 90. Similar functions are performed by the stages 92, 94 and 96. That is, the adjustments to be applied to each of the tap-weight coefficient stages 26, 28, 30 and 32 is defined by the equation (28).

Equations (29) and (30) express a simplification which may be used with the adjustment circuitry 12 in which the inputs to the lines 118, 120, 122 and 124 are each made the same, thus effecting only the relative convergence rates for the tap-weight coefficients of the stages 26, 28, 30 and 32.

Equation (31) provides another simplification in the operation of the adjustment circuitry 12 in which the charge-transfer inefficiency parameters used in the stages 108, 112 and 116 are each made equal to a single effective value of charge-transfer inefficiencies. However, the simplification shown in equation (31) is not advisable for CTD transversal filters 10 which have significant variations in charge-transfer inefficiencies between the charge-storage cells of the delay line 22.

Definitions $K_{p,n}$ is the ratio of the peak amplitude of the pulse measured at the filter tap n to the peak amplitude of the pulse provided at the filter input as a step in the tap-weight-adjustment method.

$n_n$ is the charge-transfer inefficiency of the charge-transfer filter element n.

$K_{dc,n}$ is the ratio of the dc signal level at the filter tap n to the dc signal level provided at the filter input as a step in the tap-weight-adjustment method.

$R(\omega)$ is the desired frequency response to be produced by the CTD transversal filter.

$\omega_s$ sampling or clocking frequency of the CTD transversal filter in radians/second.

$c_n$ is the tap weight coefficient for the CTD transversal filter element n.

$b_n$ is the tap-weight coefficient for a reference transversal filter element n.

$f_n$ is the fixed-pattern noise for the CTD transversal-filter element n.

$\omega$ is the frequency of the input signal provided to the CTD-transversal filter during use of the filter.

$\alpha_n$ is the effective tap weight of the CTD transversal filter element n.

G(z) is the overall transfer function of the CTD transversal filter.

N(z) and D(z) are the numerator and denominator functions, respectively, for the function G(z).

The following equations express the relationships disclosed in the preceding description and point out the theory of operation of the invention. The number enclosed in parentheses to the right of each equation is the equation number referred to in the preceding text.

$$\frac{X_k}{X_{k-1}} = \frac{(1 - n_k)z^{-1}}{1 - n_k z^{-1}} \qquad (1)$$

$$\frac{Y_k}{X_k} = \frac{1 - f_k}{1 - n_k} \qquad (2)$$

$$\frac{Y_n}{X_o}(z) = \frac{1 - f_n}{1 - n_n} \prod_{k=1}^{n} \frac{(1 - n_k)z^{-1}}{1 - n_k z^{-1}} \qquad (3)$$

$$G(z) = \sum_{n=1}^{M} \frac{c_n(1 - f_n)}{1 - n_n} \prod_{k=1}^{n} \frac{(1 - n_k)z^{-1}}{1 - n_k z^{-1}} \qquad (4)$$

$$= \frac{N(z)}{D(z)}$$

$$N(z) = \sum_{n=1}^{N} a_n z^{-n} \quad (5)$$

$$D(z) = \prod_{k=1}^{M}(1 - \eta_k z^{-1}) = 1 - \sum_{m=1}^{M} \beta_m z^{-m} \quad (6)$$

$$a_n = \left[ c_n(1 - f_n) - c_{n-1}\frac{1 - f_{n-1}}{1 - \eta_{n-1}}\eta_\eta \right] \prod_{i=1}^{\eta-1}(1 - \eta_i) \quad (6.5)$$

$$= c_n K_{p,n} - \eta_\eta c_{\eta-1} K_{p,\eta-1} \quad (7)$$

$$c_o = f_o = \eta_o = 0 \quad (8)$$

$$K_{p,n} = \frac{1 - f_n}{1 - \eta_\eta} \prod_{i=1}^{\eta}(1 - \eta_i) \quad (9)$$

$$K_{dc,n} = \frac{1 - f_n}{1 - \eta_n} \quad (10)$$

$$K_{p,n} = K_{dc,n} \prod_{i=1}^{M}(1 - \eta_i) \quad (11)$$

$$\eta_n = 1 - \frac{(K_{p,n})(K_{dc,n-1})}{(K_{dc,n})(K_{p,n-1})} \quad (12)$$

$$K_{dc,o} = K_{p,o} = 1 \quad (13)$$

$$|R'(\omega)| = |R(\omega)| \, |D(z)|_{z=e^{j\omega T}} \quad (14)$$

$$= |R(\omega)| \left| \prod_{k=1}^{M}(1 - \eta_k z^{-1}) \right|_{z=e^{j\omega T}} \quad (15)$$

$$= |R(\omega)| \prod_{k=1}^{M} \sqrt{1 - 2n_k \cos 2\pi \frac{\omega}{\omega_s} + n_k^2} \quad (16)$$

$$|R'(\omega)| = \left| \sum_{n=1}^{N} b_n z^{-n} \right|_{z=e^{j\omega T}} \quad (17)$$

$$\frac{U(z)}{X_0(z)} = \frac{1}{1 - \sum_{m=1}^{M}\beta_m z^{-m}} \quad (18)$$

$$Y(z) = U(z) \sum_{m=1}^{M} a_m z^{-m} \quad (19)$$

$$R(z) = U(z) \sum_{m=1}^{M} b_m z^{-m} \quad (20)$$

$$e_n = r_n - y_n \quad (21)$$

$$\Delta c_k = -\nabla_{c_k} J = -\mu_k \frac{dJ}{de_n} \frac{\partial e_n}{\partial c_k} = \mu_k p_n \frac{\partial y_n}{\partial c_k} \quad (22)$$

if $p_n = e_n$, then $J = \min \tfrac{1}{2} e_n^2$, $\quad$ (23)
an unbiased estimator for min. MSE if $p_n = \text{sgn}(e_n)$, then $J = \min |e_\eta|$, $\quad$ (24)
an unbiased estimator for min. MAE $$y_n = \sum_{m=1}^{M} \alpha_m u_{n-m} \quad (25)$$

$$\frac{\partial y_n}{\partial c_k} = \sum_{m=1}^{M} u_{n-m} \frac{\partial a_m}{\partial c_k} = K_{p,k}[u_{n-k} - n_{k+1}u_{n-(k+1)}] \quad (26)$$

$$\frac{\partial a_m}{\partial c_k} = \begin{cases} K_{p,k} & k = m \\ -n_{k+1} K_{p,k} & k = m - 1 \\ 0 & \text{otherwise} \end{cases} \quad (27)$$

$$\Delta c_k = u_k p_n K_{p,k}[u_{n-k} - \eta_{k+1}u_{n-(k+1)}] \quad (28)$$

$$\Delta c_k = u_o p_n v_n \quad (29)$$

where $$v_n = u_n - n_{n+1}u_{n+1} \quad (30)$$

(For $u_o = 2^{-12}$, the $c_k$ limit cycle is $\pm 1$ bit)

$$\eta_e = \frac{1}{M} \sum_{k=1}^{M} n_k \quad (31)$$

What is claimed is:

1. A method for adjusting the tap weights ($c_n$) in a charge-transfer-device (CTD) transversal filter having a plurality (M) of charge storage cells in order to achieve a filter frequency response $R(\omega)$ wherein, $\omega$ is the frequency of the input signal to the filter and wherein a clock signal frequency $\omega_S$ is used by the filter; said method comprising the steps of:

(a) measure the charge-transfer inefficiency ($\eta$) of each of said charge storage cells;

(b) determine reference tap weights ($b_\eta$) corresponding to a modified frequency response ($R'(\omega)$) as follows:

$$|R'(\omega)| = |R(\omega)| \prod_{k=1}^{M} \sqrt{1 - 2n_k \cos 2\pi \frac{\omega}{\omega_s} + n_k^2}$$

(c) apply a pseudo-random-noise sequence as said input signal of said CTD filter;

(d) determine error signal $e_n$ based on the difference between the output of said CTD-transversal filter and a reference transversal filter having M taps with tap weights equal to said $b_n$, wherein said reference transversal filter has an input provided from the output from the Mth tap of said CTD transversal filter;

(e) determine a performance criterion $p_n$ based on the error signal $e_n$ so that the error signal $e_n$ may be minimized;

(f) increment said tap weights of said transversal filter as follows:

$$\Delta C_k = \mu_k p_n K_{p,k}[u_{n-k} - \eta_{k+1} u_{n-(k+1)}]$$

wherein $\mu$ is a convergence controlling parameter for each of the tap coefficients $c_n$, $K_{p,n}$ is the gain of the nth CTD cell when a pulse signal is applied, and $U_n$ is the output of the nth tap of said reference transversal filter.

2. The method of claim 1 wherein said step (a) of determining charge-transfer inefficiency (CTI) and fixed-pattern noise (FPN) comprises:

applying a zero frequency input signal to said CTD filter input;
   measuring the response at each of said CTD filter taps to said zero frequency input signal;
   applying a pulse input signal to said CTD filter input;
   measuring the response at each of said CCd filter taps to said pulse input signal; and
   computing the CTI and FPN for each of said filter cells based on the measured tap responses to said zero frequency and pulse input signals.

3. An adjustment apparatus for adjusting tap weights in order to achieve a desired frequency response for a charge-transfer-device (CTD) transversal filter having a CTD filter input, a tapped-CTD delay line having a CTD-delay-line input responsive to said filter input and a CTD delay-line output at the opposite end of said delay line from said input, wherein said CTD-delay line has a plurality of charge-storage cells having CTD-tap outputs responsive to said cells, said CTD-transversal filter further having a plurality of adjustable tap-coefficient-weighting stages having inputs responsive to said CTD-tap outputs and having weighted outputs, said CTD-transversal filter further having an adder stage for adding together said weighted outputs to produce an adder output signal, said CTD-transversal filter having a CTD-filter output responsive to said adder-output signal, and wherein said adjustment apparatus comprises:

means for determining the charge-transfer inefficiency for each of said charge-storage cells;

means for providing an adjustment test signal to said CTD-filter input;

a reference transversal filter having a reference filter input responsive to said CTD-delay-line output, a tapped reference delay line having a reference-delay-line input responsive to said reference filter input, wherein said reference-delay-line has a plurality of delay stages arranged in sequence along said delay line and having reference tap outputs responsive to said delay stages, said reference transversal filter further having a plurality of reference tap-coefficient-weighting stages set in accordance with said desired frequency response, said reference weighting stages having inputs responsive to said reference-tap outputs and having weighted reference outputs, said reference transversal filter further having a reference adder stage for adding together said weighted reference outputs to produce a reference adder output signal, said reference transversal filter having a reference-filter output responsive to said reference-adder-output signal;

means for comparing and producing an indication of the difference between said reference-filter output and said CTD-filter output;

a plurality of means for subtracting the products of each reference tap output and its corresponding CTD-cell charge-transfer inefficiency from the preceding reference-tap output, wherein said cell charge-transfer inefficiency is responsive to said means for determining; and a plurality of means for adjusting said CTD tap-coefficient-weighting stages responsive to said indication produced by said means for comparing and producing and to each corresponding means for subtracting.

4. The apparatus of claim 3, wherein said means for determining the charge-transfer inefficiency comprises:

means for supplying a zero-frequency input signal to said CTD-filter input;

means for supplying an isolated pulse input signal to said CTD-filter input;

means for measuring the signals on said CTD-tap outputs due to said zero-frequency input and to said pulse input so that said charge-transfer inefficiency may be computed for each of said charge storage cells.

5. The apparatus of claim 3 further comprising a sychronizing delay stage responsive to said CTD delay line output and for producing a synchronizing delay stage output, and wherein said reference-filter input is responsive to said synchronizing delay-stage output so that the operation of said reference transversal filter is synchronized with said CTD-transversal filter.

6. For a charge-transfer-device (CTD) transversal filter including input terminal means for receiving test signals representative of a pseudo-random-noise sequence, output terminal means for providing a filtered output signal having a particular frequency response, a tapped delay line interconnected with said input terminal means and having a plurality of series connected, charge-storage cells having tapped outputs responsive to said cells, and a plurality of tap-weighting gain stages respectively connected to said charge-storage cells to set the tap-weight coefficients of said cells, the improvement of a tap-weight-coefficient adjustment circuit to selectively adjust the tap-weight coefficients of each of said gain stages for generating the filtered output signal having the particular frequency response, said adjustment circuit connected in feedback relationship between the last charge-storage cell of said tapped delay line and said gain stages and comprising a reference transversal filter for receiving an unfiltered signal from said tapped delay line and providing a reference output signal in response to the test signals at said CTD transversal filter input terminal means, and means for setting the tap-weight coefficients of said gain stages in response to the difference between the reference output signal provided by said reference transversal filter and said filtered output signal provided by said CTD transversal filter, the characteristic charge-transfer inefficiencies of the charge-storage cells of said tapped delay line, and the response of said charge-storage cells to the test signals applied to said CTD transversal filter input terminal means.

7. For the charge-transfer-device (CTD) transversal filter recited in claim 6, wherein the reference transversal filter of said tap-weight-coefficient adjustment circuit includes a tapped reference delay line having a plurality of series connected reference delay elements having respective reference tap outputs responsive to said delay elements, a plurality of reference tap coefficient stages provided with predetermined tap-weight coefficients to produce said filtered output signal with the particular frequency response at said CTD transversal filter output terminal means, and reference adding means to provide the reference output signal from said reference transversal filter, said reference delay elements interconnected between the tapped delay line of said CTD transversal filter and respective ones of said reference tap-coefficient stages, and output terminals of said tap-coefficient stages connected to said reference adding means, such that said reference output signal provided thereby is indicative of the sum of the output signals of said reference tap-coefficient stages.

8. For the charge-transfer-device (CTD) transversal filter recited in claim 7, wherein said tap-weight-coefficient adjustment circuit further comprises signal delay means connected between the tapped delay line of said CTD transversal filter and the reference tapped delay line of said reference transversal filter for delaying the supply of said unfiltered signal from said CTD transversal filter to said reference transversal filter, such that said CTD and reference transversal filters operate in synchronism relative to one another.

9. For the charge-transfer-device (CTD) transversal filter recited in claim 7, wherein said CTD transversal filter also includes adding means interconnected with an output terminal of each of said plurality of tap-weighting gain stages to provide the filtered output signal at said filter output terminal means, the filtered output signal provided by said adding means being indicative of the sum of the output signals of said gain stages, and said tap-weight-coefficient adjustment circuit further comprising summing means responsive to both the filtered output signal from said CTD transversal filter output terminal means and the reference output signal from the reference adding means of said reference transversal filter, said summing means providing an error output signal which is representative of the difference between said filtered and reference output signals, said error output signal controlling the adjustment of the tap-weight coefficients of said tap-weighting gain stages.

10. For the charge-transfer-device (CTD) transversal filter recited in claim 9, wherein said tap-weight-coefficient adjustment circuit also comprises a plurality of multiplier stages being interfaced with respective ones of said CTD transversal filter tap-weighting gain stages and providing output signals for adjusting the tap-weight coefficients of said gain stages for producing the filtered output signal having the particular frequency response, said multiplier stages providing output signals which are the products of input signals thereto, which input signals are representative of the error output signal provided by said summing means, the characteristic charge-transfer inefficiencies of respective charge storage cells which form the delay line of said CTD transversal filter, and the pulse gain expressed as a ratio of the peak amplitude of a pulse of the test signal at said CTD transversal filter input terminal means to the peak amplitude which is measured from a pulse at respective tap outputs of said CTD transversal filter.

11. For the charge-transfer-device (CTD) transversal filter recited in claim 10, wherein said tap-weight-coefficient adjustment circuit also comprises a plurality of subtracting means for subtracting the products of respective reference tap outputs of said reference delay elements and respective charge-transfer inefficiencies corresponding to charge-storage cells of said CTD transversal filter from the preceding reference tap output of said reference delay elements, said subtracting means being interfaced with respective ones of said multiplier stages for providing the input signal thereto which is representative of said charge-storage inefficiency.

* * * * *